(12) United States Patent
Kamakura

(10) Patent No.: US 7,795,796 B2
(45) Date of Patent: Sep. 14, 2010

(54) WIRING SUBSTRATE, ELECTRO OPTIC DEVICE AND ELECTRONIC EQUIPMENT

(75) Inventor: Tomoyuki Kamakura, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 1137 days.

(21) Appl. No.: 11/330,172

(22) Filed: Jan. 12, 2006

(65) Prior Publication Data

US 2006/0157855 A1   Jul. 20, 2006

(30) Foreign Application Priority Data

Jan. 18, 2005   (JP) ............................. 2005-009960

(51) Int. Cl.
*H01J 1/62* (2006.01)
(52) U.S. Cl. ...................... 313/500; 313/498
(58) Field of Classification Search ................ 313/520, 313/498–512; 445/23–25
See application file for complete search history.

(56) References Cited

U.S. PATENT DOCUMENTS

| | | | | |
|---|---|---|---|---|
| 5,517,387 | A | * | 5/1996 | Smith ..................... 361/679.32 |
| 6,864,639 | B2 | | 3/2005 | Ito |
| 7,026,754 | B2 | | 4/2006 | Nakanishi |

FOREIGN PATENT DOCUMENTS

| | | |
|---|---|---|
| JP | A 62-280890 | 12/1987 |
| JP | A 63-261384 | 10/1988 |
| JP | A 04-050920 | 2/1992 |
| JP | A 04-214536 | 8/1992 |
| JP | A 06-283859 | 10/1994 |
| JP | A-06-283859 | 10/1994 |
| JP | A 10-307298 | 11/1998 |
| JP | A 2001-215483 | 8/2001 |
| JP | A 2002-123192 | 4/2002 |
| JP | A 2004-101948 | 4/2004 |
| JP | A 2004-184531 | 7/2004 |
| JP | A 2004-327794 | 11/2004 |
| JP | A 2005-079472 | 3/2005 |
| JP | A-2005-079472 | 3/2005 |
| JP | 2006140431 A * | 6/2006 |
| WO | WO 03/098696 A1 | 11/2003 |

* cited by examiner

*Primary Examiner*—Joseph L Williams
(74) *Attorney, Agent, or Firm*—Oliff & Berridge, PLC

(57) ABSTRACT

A wiring substrate includes; a wiring composed of a conductive film and formed on a substrate; and an insulating layer, wherein the insulating layer is arbitrarily arranged among the conductive films.

1 Claim, 4 Drawing Sheets

WIRING SUBSTRATE, ELECTRO OPTIC DEVICE AND ELECTRONIC EQUIPMENT

BACKGROUND OF THE INVENTION

1. Technical Field

The present invention is related to a wiring substrate, more particularly, a high reliable substrate where the compression stress and tensile stress of an insulating layer formed on a substrate are constrained and the parasitic capacitance of wiring is partially constrained, electro optic circuit and electronic equipment using the wiring substrate.

2. Related Art

A wiring substrate using a conductive film is widely applied to various electronic equipment using electronic circuits and displays and various types if it are proposed. In many cases, such wiring substrate using a conductive film is provided with multiple layered wiring structures. Further, when supplying sufficient current to an element such as a display element, it is necessary to enlarge a wiring width and wiring thickness. Thus, an insulating layer of the substrate becomes thicker thereby. Thus, a substrate is happened to be bent and deformed by the compression stress and tensile stress of between insulating layers for multiple layers and an multiple wirings made of conductive films. This defect badly affects manufacturing processes and lowers quality and yield.

Further, even in an element in which a high speed driving is required because of the high performance of elements and a large sized wiring substrate, the above issue generates parasitic capacitance and wiring delay. In order to reduce this issue, the material for wiring is generally changed to low resistant or low dielectric (low-k) material. However, the cost for material is increased and the deformation of a substrate caused by film stress is revealed.

As a method of constraining bent of a wiring substrate, JA6-283859 suggests cooling with giving compressed stress to the horizontal direction of an insulating layer during the process of forming an insulating layer of the multi-layered wing.

However, in the case of JA 6-283859, even reducing the tensile stress of an insulating layer, it is difficult to arrange the compression stress at the time of cooling. If performing wrong arrangement, it causes insufficient reduction of the tensile stress and yielding the compression stress. Further, even when the stresses can be reduced during manufacturing, other stresses may yield by thermal expansion during using. It is extremely difficult to solve the issues of the stresses of an multi wirings and the delay of wirings at the same time.

If an insulating layer has thicker thickness as to constrain wiring capacitance of multi layer wirings, the stress of a substrate becomes large. When an wiring is formed on a glass or flexible substrate, it is necessary to make it endure tensile stress, compression stress, other stress and twist. Further, if a substrate having a large area is used, it is possible to yield indispensable twist and deformation of a substrate with tiny stresses.

SUMMARY

The present invention is to simultaneously resolve the above issues, constrain the yield of the tensile stress and the compression stress, being capable of reducing these stresses even if they yield, to provide a wiring substrate, and an substrate, which reduces parasitic capacitance yielding among wirings and constrains wiring delay, and to provide an electro optic device and electronic equipment using such substrate.

In order to solve the above issues, an first aspect of the invention comprises: a wiring composed of a conductive film and formed on a substrate; and an insulating layer, wherein the insulating layer is arbitrarily arranged among the conductive films.

In this wiring substrate, it is desirable to form an insulating layer without forming it during wirings arranged in parallel each other among the above wirings.

Further, it is desirable that a plurality of column lines are crossed with a plurality of row lines and the insulating layer is formed at the cross section. A display element, which is connected to one of a plurality of the row lines and one of a plurality of column lines, is formed at the cross section of the row lines and column lines, and the insulating layer is not formed among the displays adjacently located each other.

Further, it is desirable that a plurality of column lines are crossed with a plurality of row lines, and an insulating layer is formed directly under row lines and a insulating layer is formed with the same pattern of an wiring.

Further, it is desirable that a plurality of column lines are crossed with a plurality of row lines, and an insulating layer is formed directly under column lines The insulating layer is formed with the same pattern of a wiring. The insulating layer at the cross section has a dome or cylindrical shape and is regularly arranged It is desirable in the above substrate that the insulating layer is formed with a constant distance from the reference surface in parallel with a substrate surface, or the insulating layer is formed with varying the distance from the reference surface in parallel with the substrate surface. Further, in the wiring substrate, the conductive film and the insulating layer have double or more than double layers.

It is desirable that the above wiring substrate is a glass substrate or flexible substrate.

In other aspect of the invention, an electro optic device comprises a wiring made of a conductive film where a plurality of column lines are crossed with a plurality of row lines; a display element which is connected to one of a plurality of column lines and a plurality of column lines and formed at the cross section; and a driving circuit connected to a wiring.

In other aspect of the invention, an electronic device comprises: an electro optic device including; a wiring made of a conductive film where a plurality of column lines are crossed with a plurality of row lines; a display element, which is connected to one of a plurality of the row lines and one of a plurality of column lines, is formed at the cross section of the row lines and column lines, a driving circuit connected to the wiring and an electronic circuit makes the electro optic device function as a display.

BRIEF DESCRIPTION OF THE DRAWINGS

The invention will be described with reference to the accompanying drawings, wherein like numbers refer to like elements and wherein.

DESCRIPTION OF EMBODIMENTS

The preferred embodiments of the invention are explained referring with figures.

1. Electro Optic Device

Figure 1:
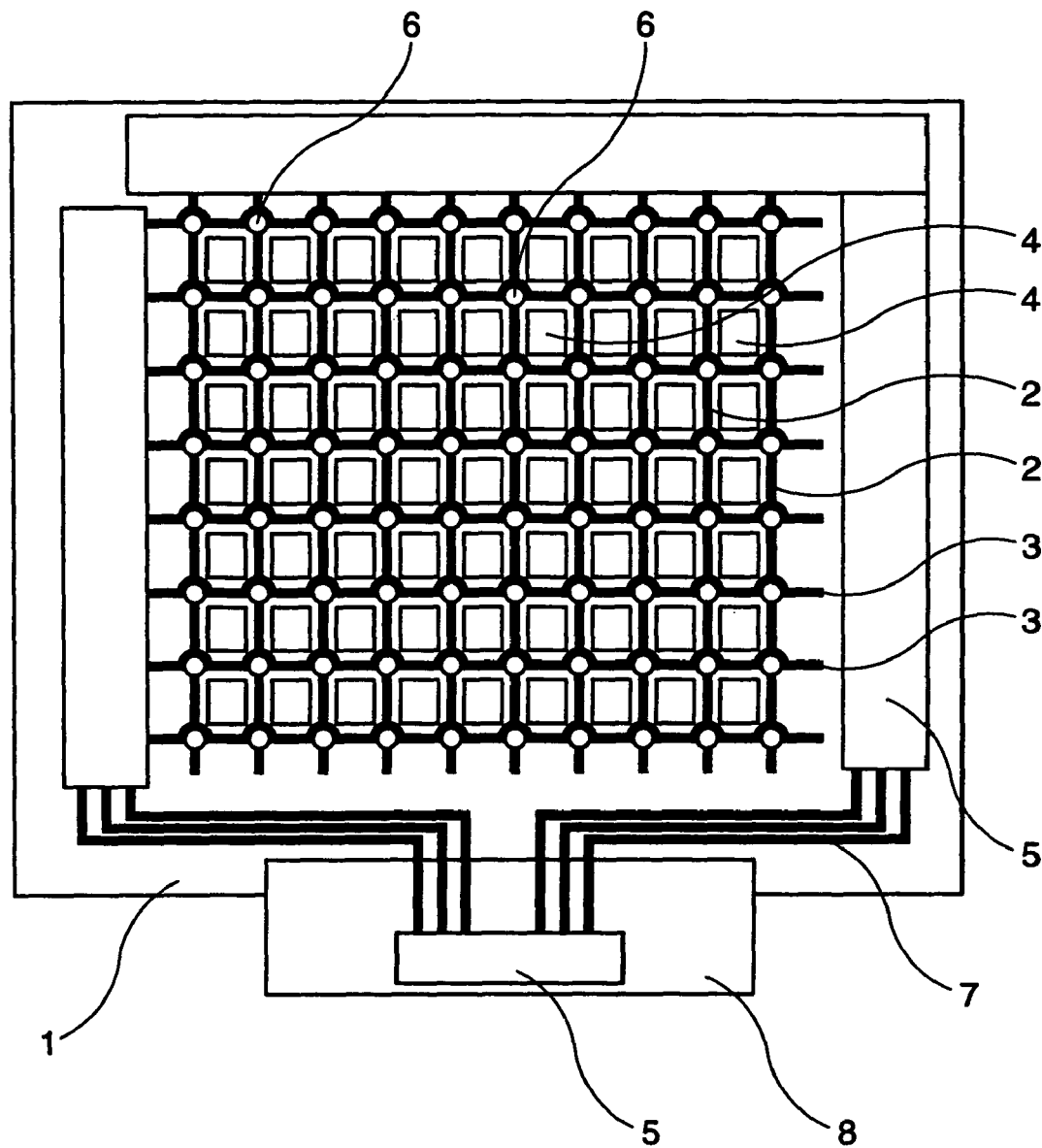
FIG. 1 shows a schematical view of an electro optical device having a wiring substrate according to the embodiment.

FIG. 1 shows a schematical view of an electro optical device having a wiring substrate according to the embodiment. In an organic EL display device as one example of an electro optical device, on a glass substrate 1, which is transparent, cross wiring includes a plurality of source lines 2 (row lines) made of conductive films and a plurality of scanning lines 3 (column lines) made of conductive films. Further, organic EL elements 4 as display elements arranged in a matrix are formed. On a flexible printing circuit (FPC) substrate 8, a driving circuit 5, which supplies signals and power source, is connected to a source line 2 and a scanning line 4 located on the glass substrate via outer wirings 7. The glass substrate 1 is fixed to the FPC substrate 8 with adhesive.

The organic EL element 4, which is provided at every cross section of the power source line 2 and the scanning line 3, is connected to a source line 2 and a scanning line 4 at the cross section via a thin film transistor and a capacitance, not shown in the figure. Here, numbers of pixels are only 20, but, more than one million pixel are arranged for example.

2. Insulating Layer

Figure 2A:
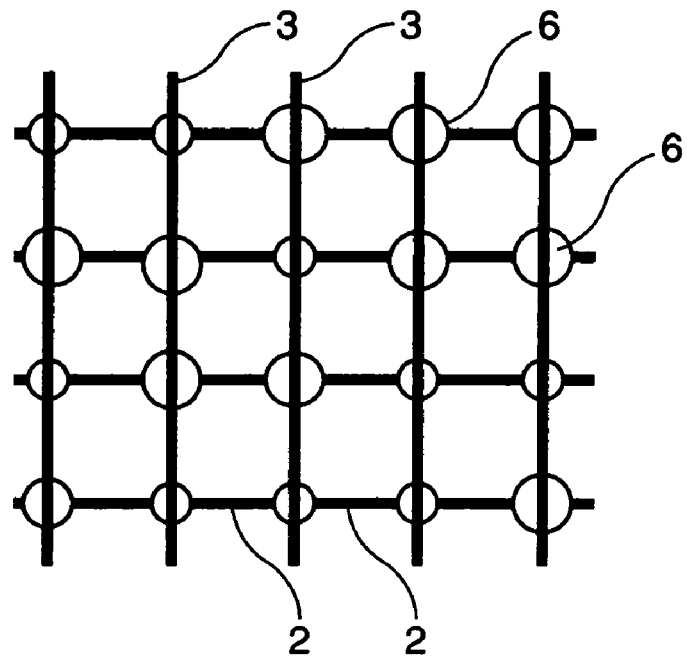
FIG. 2 shows an example of conductive film and insulating layer.
Figure 2B:
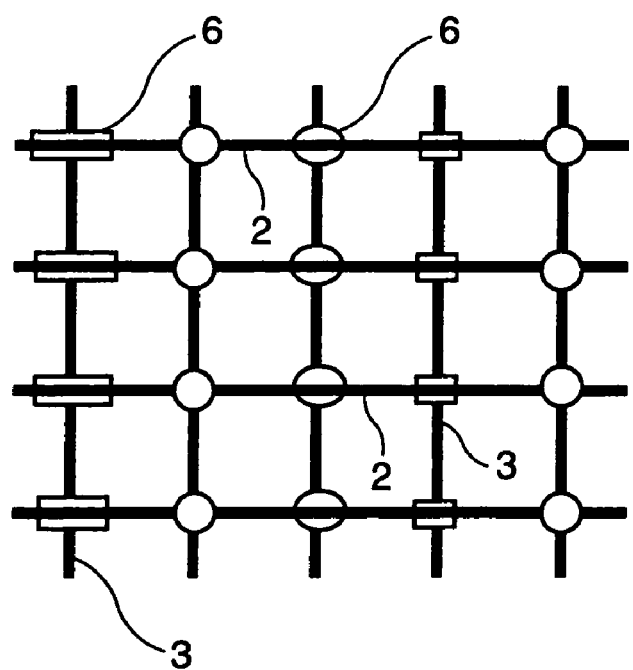
Figure 3A:
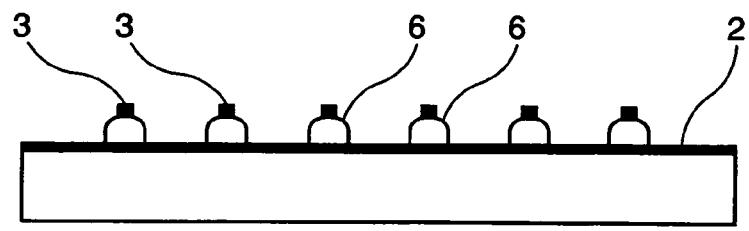
FIGS. 3A and 3B are cross sections of an conductive film and insulating layer
Figure 3B:
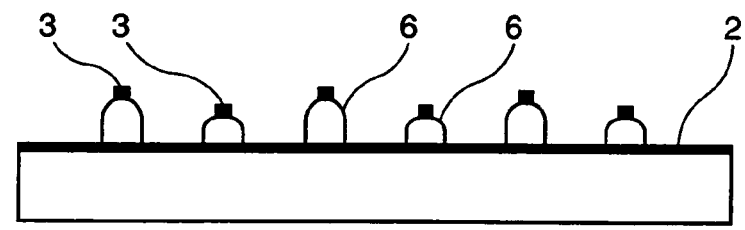
Figure 3C:
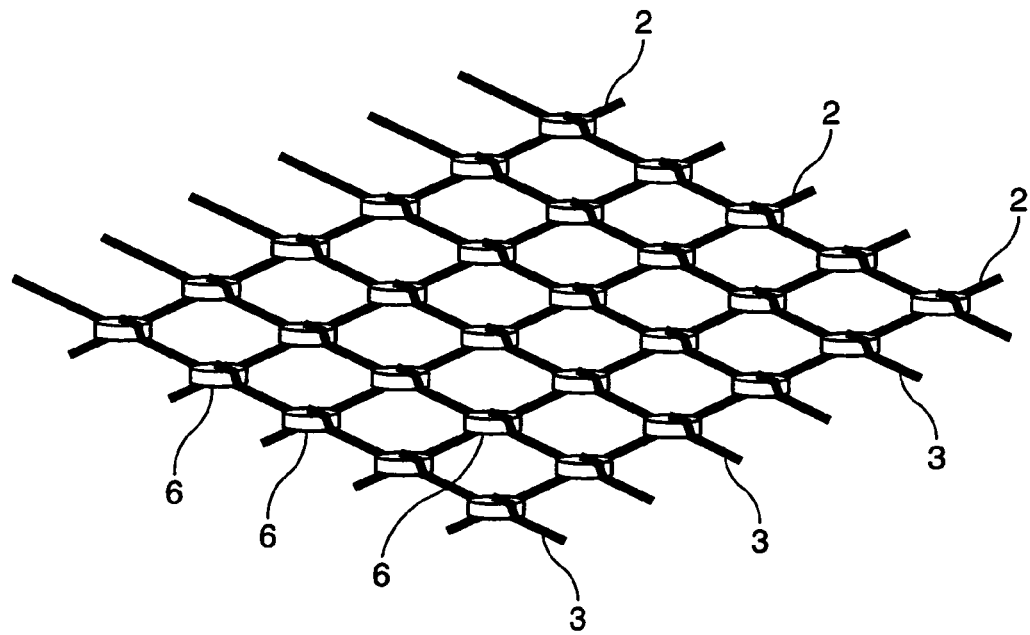
FIG. 3C is a perspective view including an conductive film and insulating layer.

Multiple wiring layers are provided with the power source lines 2 and scanning lines 3 on the glass substrate 1 and the outer wirings 7. Multiple insulating layers 6a re formed among multiple wiring layers 7. FIGS. 2A and 2B show the configuration of the multiple insulating layers 6. FIGS. 2A and 2B show plain views. FIGS. 3A and 3B show cross sections. FIG. 3C shows a perspective view. Circuit elements such as the organic EL element 4 are omitted in FIGS. 2A,B and 3A, 3B, and 3C. The configuration of the insulating layer 6 is circular shown in FIGS. 2 A, 2B and 3A,B and C, which is formed on the wiring and arbitrary shape such as dome and cylindrical.

Further, as shown in FIGS. 2 and 3, the insulating layer 6 is located at the source line 2 and the scanning line 3 which cross each other and it's size can be arbitrarily changed.

As shown in FIG. 2B, the insulating layers 6 may be arranged having regular pattern of their shape. This arrangement can constrain the stresses of the whole film with this pattern, improving reliability of the wiring substrate.

The thickness of the insulating layers 6 is arbitrarily formed along with various wirings as shown in FIG. 3B. This arbitrarily forming can reduce parasitic capacitance yielded between wirings at every cross point without controlling it as a whole, constraining wiring delay. Therefore, stress is relaxed and wiring delay is constrained, improving reliability of wiring substrate.

Thus, forming the insulating layers 6 can constrain stresses even when factors causing stresses such as thermal expansion yield between conductive films such as the power source line 2 and the scanning lines 3 and the insulating layers 6 or the glass substrate 1 as shown in FIG. 3B. Further, even when stresses yield, such stresses can be reduced sine the insulating layers 6 are finely formed with various patterning. Such constraining stresses or reducing them can be applied to the compression stress and tensile stress, fairly improving freedom of selecting substrate materials or wiring materials and manufacturing processes.

Further, the thickness of the insulating layer 6 can be arbitrarily controlled if it is necessary, reducing parasitic capacitance yielded among wirings and Constraining yielding wiring delay and fairly improving the degree of freedom of selecting a wiring material, manufacturing processes and designing circuits and increasing reliability.

Further, the glass substrate 1 is inflexible, but the FPC 8 is flexible and easy bent. If the present embodiment is applied to the flexible substrate, the yield of stress can be reduces and it prevents wiring and a substrate from being damaged even if the substrate is bent or rolled.

3. Manufacturing Process

The following is a manufacturing process for a wring substrate, in particular, the glass substrate 1. First, a metal film such as aluminum is formed on the glass substrate 1. Next, a photo resist layer is coated on this film, exposed with light, developed, and patterned so that the film is etched. Thus, the first line, namely the scanning line 3 is formed on the substrate.

After forming the insulating layer 6 on the scanning line 3, the second line, namely the power source line 2 is formed with the same process. The configuration of the insulating layer 6 is a circle or polygon and formed by using an inkjet method or printing method. If the thickness of the insulating layer is controlled for reducing a parasitic capacitance, materials are ejected several times by an inkjet method. In case of a printing method, several times of scanning are performed. The thickness of an insulating layer can be arbitrarily controlled.

When an organic EL display is manufactured as an electro optical device, thin film elements such as thin film transistors formed on other substrate in advance and not shown here are transferred to this substrate by using a chip transfer method. According to the structure of the wiring in the present embodiment, the yield of stresses can be constrained even if heat and pressure are applied to the wiring substrate when transferring a chip. Next, an insulating layer not shown here is formed on transferred thin film elements on the wiring substrate and a pixel electrode not shown here is formed. The organic EL layer such as the organic EL element 4 is formed on the pixel electrode. Then, a common electrode and passivation layer not shown here are formed on the organic EL layer.

The outer wiring 7 on the FPC substrate 8 and the insulating layer 6 can be formed with the same process. The FPC substrate 8, in which the driving circuit 5 and the outer wiring 7 are formed, is attached to the glass substrate 1 with conducting wires so as to complete the organic EL display device.

Here, the above example is the organic EL element 4 formed on the glass substrate 1, but the present invention can be applied to the flexible substrate for twisting and bending in which wirings and elements are disposed.

4. Electronic Device

Figure 4A:
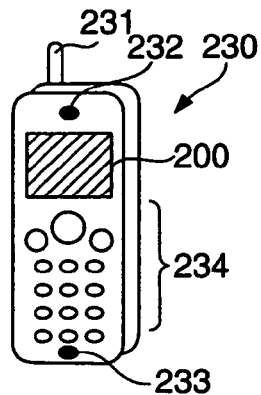
FIG. 4 shows a schematical view of an electro optical device having a wiring substrate according to the embodiment

FIGS. 4A to 4F show an example of an electronic equipment in which the organic EL display device of the present invention is used. FIG. 4A is an example of a cellar phone 230. The cellar phone 230 comprises an antenna 231, a voice output 232, a voice input 233, an operation part 234 and an organic EL display device 100 of the present embodiment.

Figure 4B:
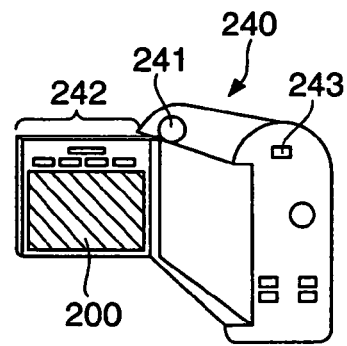

FIG. 4B is an example of a video camera 240. The video camera 240 comprises an receiver 241, a voice input 243, an operation part 242 and an organic EL display device 100 of the present embodiment.

Figure 4C:
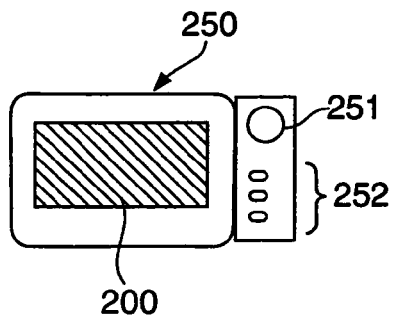

FIG. 4C is an example of a mobile personal computer 250. The computer 250 comprises a camera 251, an operation part 252 and an organic EL display device 100 of the present embodiment.

Figure 4D:
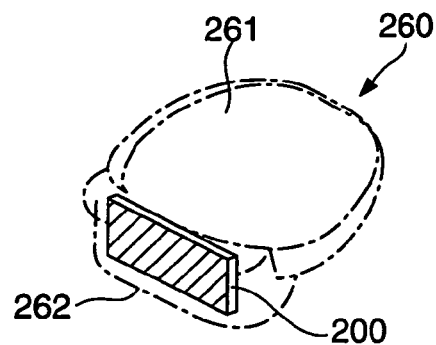

FIG. 4D is an example of a head mount display 260. The head mount display 260 comprises a band 261, a part for placing optics 262, and an organic EL display device 100 of the present embodiment.

Figure 4E:
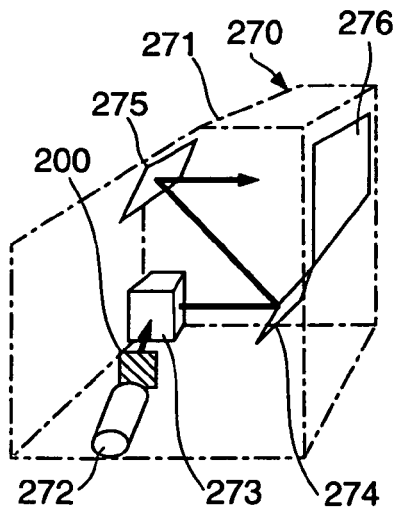

FIG. 4E is an example of a rear-type projection display 270. The projector 270 comprises aflame 271, a light source 272, an integrated optics 273, a mirror 274, 275, screen 276 and an organic EL display 100 of the present embodiment.

Figure 4F:
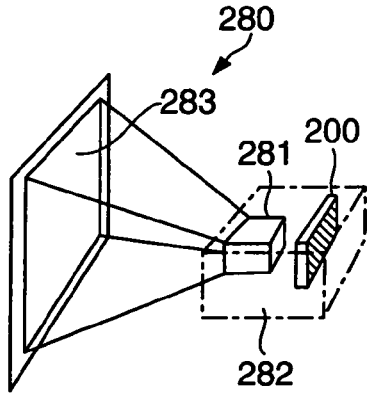

FIG. 4F is an example of a front-type projection display 280. The projector 280 comprises aflame 283, an optical system 281 and an organic EL display 100 of the present embodiment. An image is projected to the image screen 283.

The organic EL display of the present embodiment is not only applied to the above examples, but other various types electronic devices. Other examples may include fax-machine built-in displays, digital camera finders, mobile TVs, DSP, PDA, electronic notebooks, electronic bulletin boards, and advertising displays.

The wiring of the present invention is not only applied to an organic EL display but a liquid crystal display device, a plasma display and other electronic circuits.

What is claimed is:

1. A wiring substrate comprising:
   first wirings;
   second wirings intersecting the first wirings; and
   insulators disposed between only intersecting portions of the first wirings and the second wirings, the insulators being one of dome shaped and cylindrical shaped and having different thicknesses from each other.

* * * * *